United States Patent
Han

(10) Patent No.: US 7,193,883 B2
(45) Date of Patent: Mar. 20, 2007

(54) INPUT RETURN PATH BASED ON $V_{DDQ}/V_{SSQ}$

(75) Inventor: Jonghee Han, Cary, NC (US)

(73) Assignee: Infineon Technologies AG, Minich (DE)

( * ) Notice: Subject to any disclaimer, the term of this patent is extended or adjusted under 35 U.S.C. 154(b) by 0 days.

(21) Appl. No.: 10/870,100

(22) Filed: Jun. 17, 2004

(65) Prior Publication Data

US 2005/0281074 A1 Dec. 22, 2005

(51) Int. Cl.
*G11C 11/24* (2006.01)

(52) U.S. Cl. .................. 365/149; 365/227; 365/189.09

(58) Field of Classification Search ................. 365/149
See application file for complete search history.

(56) References Cited

U.S. PATENT DOCUMENTS

| | | | | |
|---|---|---|---|---|
| 5,311,391 | A * | 5/1994 | Dungan et al. | 361/56 |
| 5,440,162 | A * | 8/1995 | Worley et al. | 257/355 |
| 5,534,768 | A * | 7/1996 | Chavannes et al. | 323/267 |
| 5,877,930 | A * | 3/1999 | Gist | 257/E27.105 |
| 6,559,789 | B1 * | 5/2003 | Somayajula | 341/172 |
| 6,587,066 | B1 * | 7/2003 | Somayajula | 341/172 |
| 2004/0027742 | A1 * | 2/2004 | Miller et al. | 361/52 |

* cited by examiner

*Primary Examiner*—Thong Q. Le
(74) *Attorney, Agent, or Firm*—Patterson & Sheridan, L.L.P.

(57) ABSTRACT

Input circuit configurations that reduce the amount of input signal jitter caused by a common input signal return path, methods and circuits utilizing the same are provided. Input signal return path noise may be decoupled from the power for receiver circuits, for example, by utilizing separate power supply lines, such as $V_{DDQ}$ and $V_{SSQ}$, as input signal return path.

10 Claims, 4 Drawing Sheets

INPUT RETURN PATH BASED ON $V_{DDQ}/V_{SSQ}$

BACKGROUND OF THE INVENTION

1. Field of the Invention

Embodiments of the present invention generally relate to integrated circuit (IC) devices, and more particularly, to an input circuit configuration for reducing noise in receiver circuits caused by simultaneous switching of multiple inputs.

2. Description of the Related Art

In integrated circuit (IC) devices, input signals are applied to device pins and carried to input nodes of receivers on input signal lines. As an example, FIG. 1 illustrates a conventional IC device 100, in which input signals ($IN_{1-N}$) are carried from device pins 102 to input nodes 112 of receiver circuits 110 via input signal lines 105. Several sources of capacitance (e.g., package capacitance caused by various silicon and metal junctions on the device), shown as capacitors 104, are typically coupled to the input signal lines 105 between the device pins 102 and the input nodes 112 of the receiver circuits 110.

While one node of a capacitor 104 is coupled to the input signal line 105, the other node is typically coupled to a supply voltage line of the device, such as a $V_{DD}$ supply voltage line 106 or a ground (e.g., $V_{ss}$) line 108. Electrostatic discharge (ESD) circuits 120 may also be coupled to the input signal lines 105, to prevent the receiver circuits 110 from damage due to high voltages applied to the input signal lines 105. As illustrated, the ESD circuits 120 may also be coupled between to $V_{DD}$ and $V_{ss}$ lines 106–108.

The supply voltage lines 106–108 are typically coupled externally to a device pin 102 through some parasitic elements 114, thus serving as a return path for the input signal (e.g., a path back to the signal source external to the device 100). For example, as illustrated, the $V_{DD}$ supply voltage line 106 and a parasitic element 114D may provide a return path for an input signal during a low to high transition ('0–1'), while the GND line 108 and parasitic element 114S may provide a return path for the input signal during a high to low transition ('1–0').

As is well known, an input switching from high to low is actually discharging a capacitor that loads the input signal line. The resulting rapid change in current (di/dt) due to multiple input signals transitioning is cumulative and can momentarily raise the ground voltage level ($V_{SS}$) or lower the supply voltage level ($V_{DD}$). Depending on the polarity of input signal's transition, the quantity of current in the return path changes, which results in different common ground noise, commonly referred to as simultaneous switching noise (SSN), which can cause jitter at the input node 112 of the receiver circuits 110.

As operating frequencies continue to increase, input signals switch more and more rapidly, which typically increases input jitter caused by SSN. Furthermore, the noisy power supply lines affect operation of the receivers, as at least one of $V_{SS}$ or $V_{DD}$ is typically used to generate the output signal (depending on the polarity of the input signal).

Accordingly, what is needed is an input circuit that reduces jitter of an input signal due to a common input signal return path.

SUMMARY OF THE INVENTION

The present invention generally provides methods, input circuit configurations, integrated circuit (IC) and dynamic random access memory (DRAM) devices for reducing noise associated with rapidly switching input signals.

One embodiment provides a method for reducing jitter of an input signal applied to an input node of a receiver circuit via an input signal line. The method generally includes coupling power supply nodes of the receiver circuit to first power supply lines and providing a return path for the input signal via second power supply lines, decoupled from the first power supply lines, wherein the second power supply lines are coupled to the input signal line via capacitance between a package pin and the input node of the receiver circuit.

Another embodiment provides an input circuit configuration. The input circuit configuration generally includes a receiver circuit coupled to first power supply lines for power, an input signal line for carrying an input signal to the receiver circuit, and a return path for the input signal through input capacitance associated with the input signal line, and one or more second power supply lines, decoupled from the first power supply lines.

Another embodiment provides an integrated circuit (IC) device. The IC device generally includes first power supply lines, one or more second power supply lines, one or more package pins for receiving input signals supplied to the device, receiver circuits coupled to the first power supply lines for power, input signal lines for carrying the input signals to input nodes of the receiver circuits, and one or more common return paths for the input signals provided through input capacitance coupled to the input signal line between the package pins and input nodes of the receiver circuits and the second power supply lines.

Another embodiment provides a dynamic random access memory (DRAM) device. The DRAM device generally includes one or more memory cell arrays, one or more package pins for receiving data signals supplied to the device, the data signals carrying information to be written to the memory cell arrays, first power supply lines, one or more second power supply lines, and receiver circuits coupled to the first power supply lines for power. The DRAM device also includes data signal lines for carrying the data signals from the package pins to input nodes of the receiver circuits and one or more common return paths for the data signals provided through input capacitance between the package pins and input nodes of the receiver circuits and the second power supply lines.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally provide input circuit configurations that reduce the amount of input signal jitter caused by a common input signal return path. According to the input circuit configurations described herein, input signal return path noise may be decoupled from the power for receiver circuits, for example, by utilizing separate power supply lines, such as $V_{DDQ}$ and $V_{SSQ}$, as a common input signal return path. Therefore, if the receiver circuits do not use $V_{DDQ}$ and $V_{SSQ}$, the receiver circuits should be protected from noise on the return path.

An Exemplary Integrated Circuit Device

Figure 1:
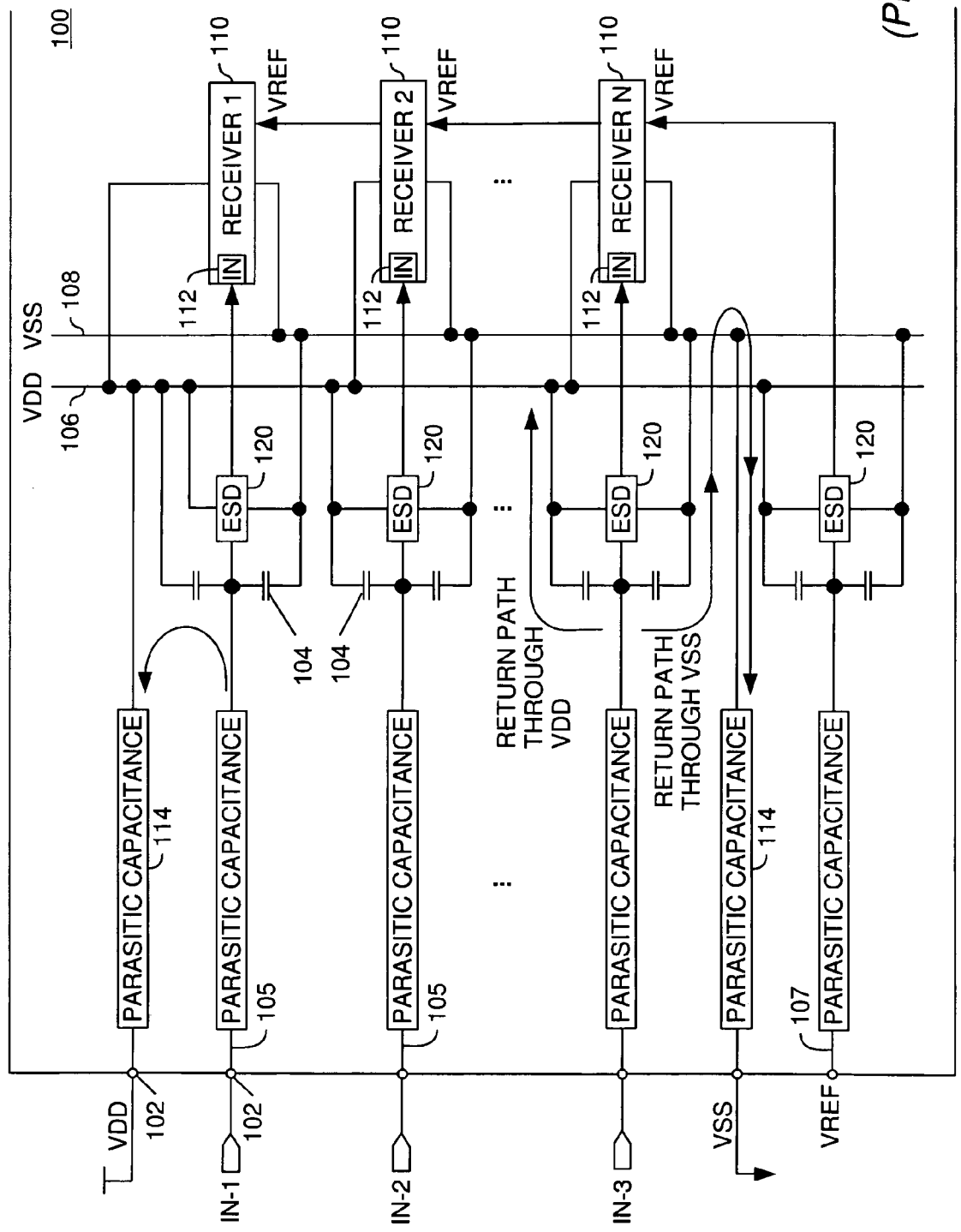
FIG. 1 illustrates an exemplary integrated circuit (IC) device in accordance with the prior art.
Figure 2:
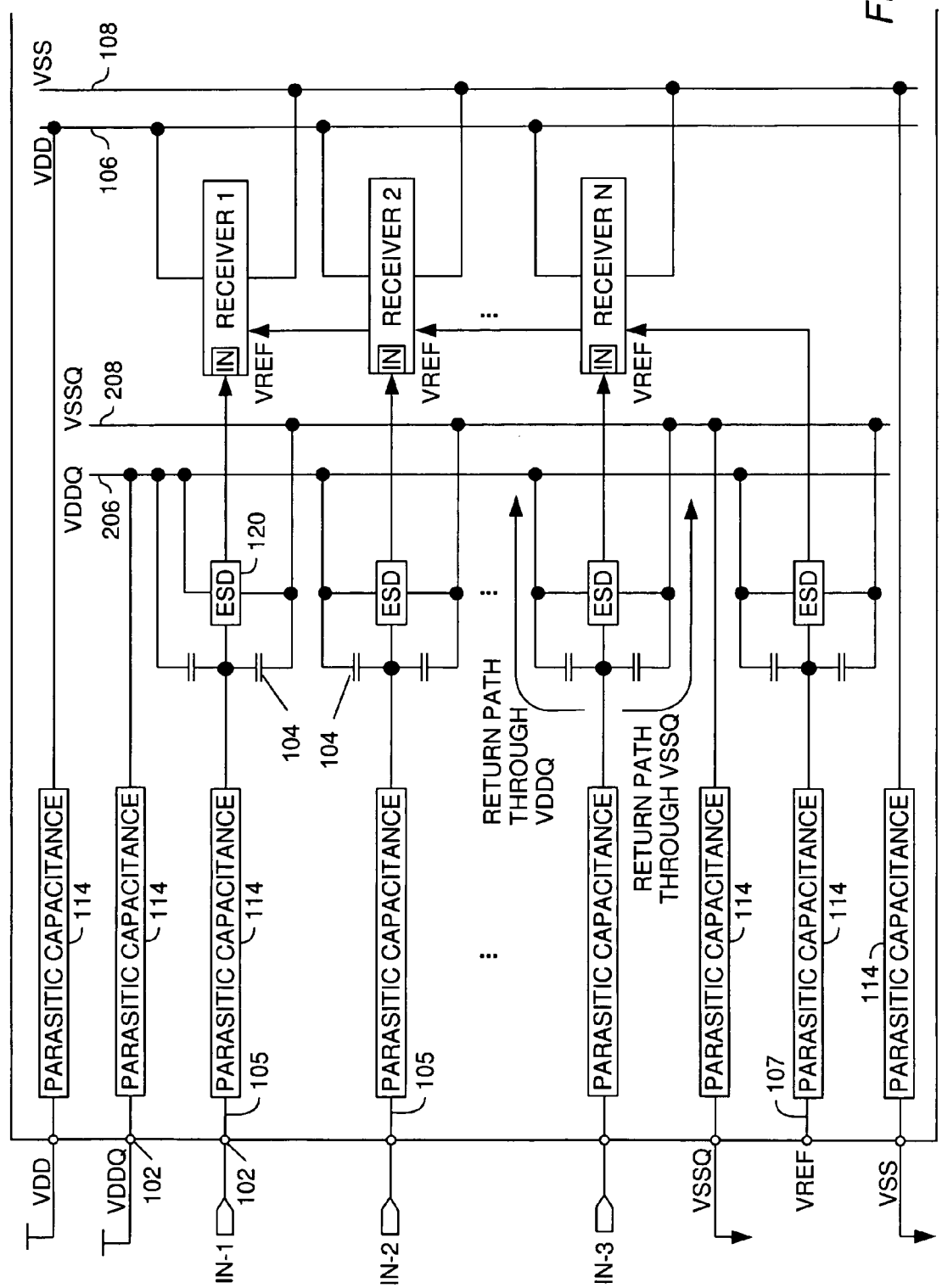
FIG. 2 illustrates an exemplary integrated circuit (IC) device in accordance with one embodiment of the present invention.
Figure 4:
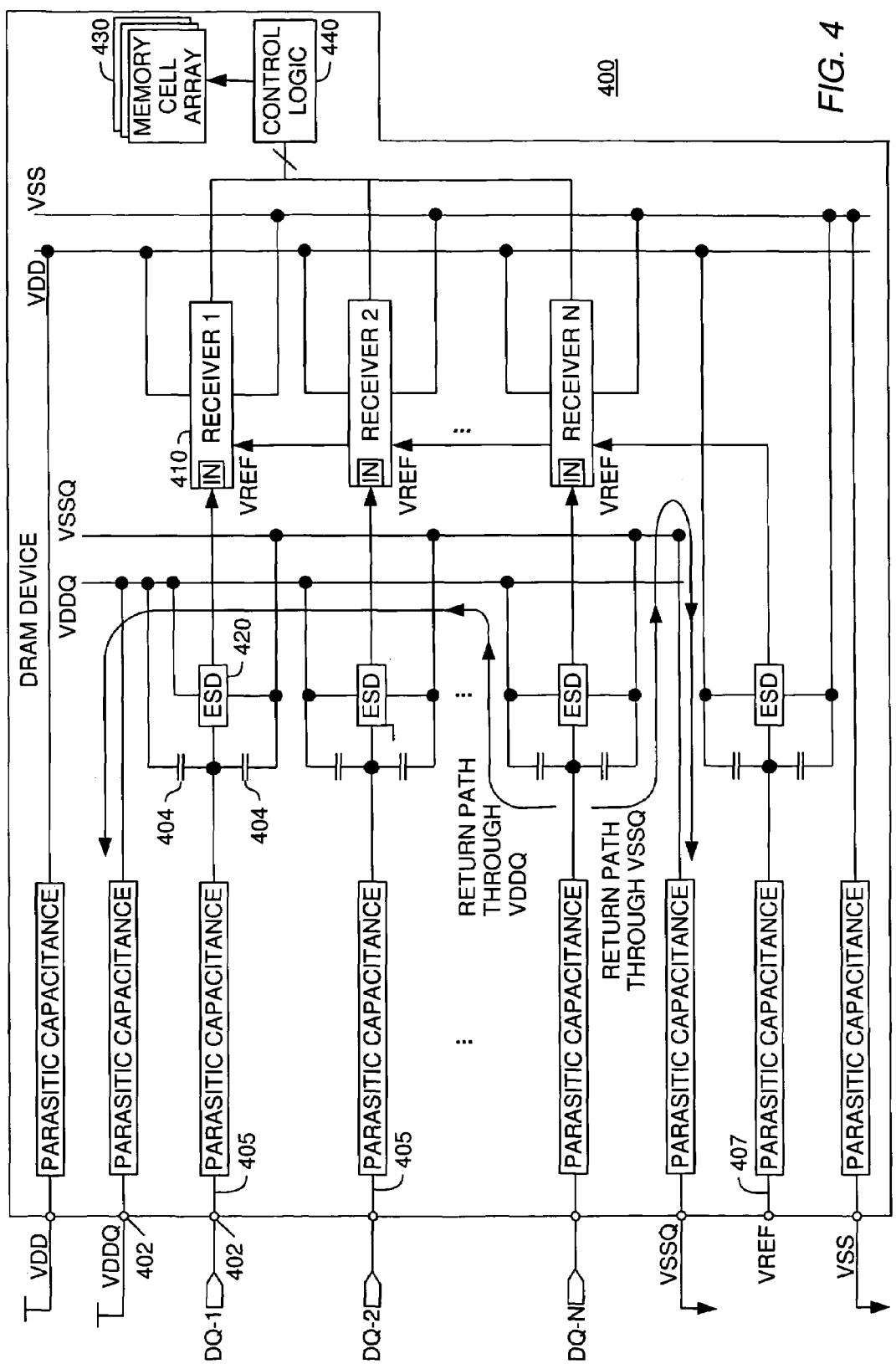
FIG. 4 illustrates an exemplary dynamic random access memory (DRAM) device in accordance with one embodiment of the present invention.

FIG. 2 illustrates an exemplary integrated circuit (IC) device 200 utilizing an input circuit configuration in accordance with one embodiment of the present invention. Input signals ($IN_{1-N}$) are carried from device pins 102 to input nodes 112 of receiver circuits 110 on input signal lines 105. The IC device 200 may be any type of IC device that receives input signals that have the potential to switch simultaneously, including, but not limited to, microprocessors, digital signal processors, other types of processors, memory controllers, and memory devices. As will be described in greater detail below with reference to FIG. 4, for some embodiments, input circuit configurations in accordance with the present invention may be utilized in dynamic random access memory (DRAM) devices.

In any case, as operating frequencies of such IC devices increase, the rate at which the input signals $IN_{1-N}$ switch increases accordingly. In an effort to reduce the effect of noise induced by this rapid switching of the input signals $IN_{1-N}$ at the input nodes 112 of the receiver circuits 110, return paths for the input signals $IN_{1-N}$ may be provided via power supply lines separate than those used to power the receiver circuits 110.

For example, as illustrated, capacitors 104 and ESD circuits 120 coupled to $V_{DDQ}$ and $V_{SSQ}$ lines 206 and 208, may provide return path for the input signals $IN_{1-N}$, while the receiver circuits 110 may be powered from $V_{DD}$ and $V_{SS}$ lines 106 and 108. As previously described, as inputs transition from high to low, the total amount of current carried in the return paths can vary, potentially shifting their voltage levels, resulting in simultaneous switching noise (SSN). However, because the receiver circuits 110 are not powered from $V_{DDQ}$ and $V_{SSQ}$ lines 206 and 208, the receiver circuits 110 are decoupled from the common input signal return path. Thus, changes in the quantity of current carried in the common return path should have minimal effect on operation of the receiver circuits 110.

While any type of power supply lines that are separate from the power supply lines used for the receiver circuit may be used to decouple the input signal switching noise from the receivers, $V_{DDQ}$ and $V_{SSQ}$ power supply lines are commonly provided to power non-critical output drivers of IC devices. Often, the allowable operating range of $V_{DDQ}$ may be relaxed based on the required signal level of the output signal generated by the output drivers. As a result, some amount of SSN may be tolerable on the $V_{DDQ}$ and $V_{SSQ}$ lines. However, the number of $V_{DDQ}$ and $V_{SSQ}$ pins is typically greater than the number of $V_{DD}$ and $V_{SS}$ lines, and the greater number of pins typically reduces noise itself.

Isolating a Reference Voltage From Switching Noise

As illustrated in FIG. 2, the receiver circuits 110 may utilize a reference voltage $V_{REF}$, to determine the logical voltage level of the input signals received at their input nodes 112. For example, a receiver circuit 110 may determine an input signal above $V_{REF}$ is a logic high or '1', while an input signal below $V_{REF}$ is a logic low or '0'. For some embodiments, as shown in FIG. 2, capacitors 104 and ESD circuits 120 of the $V_{REF}$ signal line 107 may be coupled to $V_{DDQ}$ and $V_{SSQ}$ voltage supply lines 206 and 208. However, in so doing, $V_{REF}$ shares a common signal return path with the input signals $IN_{1-N}$. As a result, $V_{REF}$ may be subjected to return path noise, resulting in an unstable reference voltage for the receivers 110.

Figure 3:
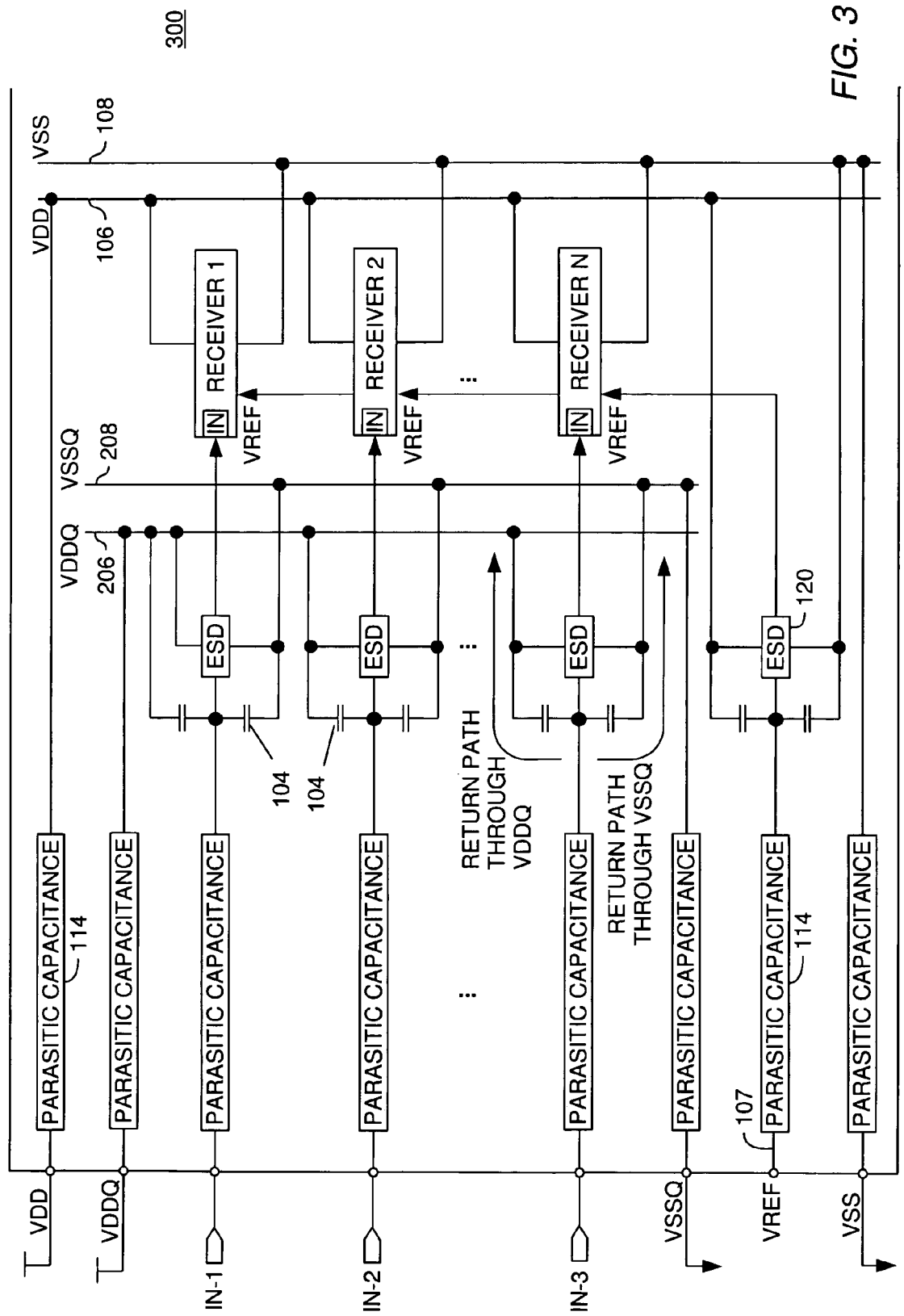
FIG. 3 illustrates an exemplary integrated circuit (IC) device in accordance with another embodiment of the present invention.

Therefore, for some embodiments, such as in the IC device 300 shown in FIG. 3, in an effort to protect $V_{REF}$ from return path noise, capacitors 104 and ESD circuits 120 of the $V_{REF}$ signal line 107 may be coupled to $V_{DD}$ and $V_{SS}$ lines 106 and 108, rather than $V_{DDQ}$ and $V_{SSQ}$ lines 206 and 208. In other words, by using different power supply lines for the input signal lines 105 and the $V_{REF}$ line 107, the changes in current carried by the return path for the input signals $IN_{1-N}$ should not affect the reference voltage $V_{REF}$. Accordingly, the receivers 110 may have a more stable reference voltage, resulting in more reliable interpretation of input signals $IN_{1-N}$.

An Exemplary Dram Device

As previously described, the input circuit configurations described herein may be utilized in any type of IC devices that receive input signals that have the potential to switch simultaneously. One example of such an IC device is the dynamic random access memory (DRAM) device 400 shown in FIG. 4.

The DRAM device 400 may include receiver circuits 410 that receive, at input nodes 412, data signals $DQ_{1-N}$ carried on data input lines 405. The data signals $DQ_{1-N}$ may be used to carry data to be written to memory cell arrays 430, via control logic 440 that receives output signals from the receivers 410, as well as address and control signals (not shown). Those skilled in the art will also recognize that data is typically carried to and from the DRAM device 400 on bi-directional data bus lines. Accordingly, those skilled in the art will recognize that, while not shown, the DRAM device 400 will typically include suitable circuitry, such as output drivers and multiplexor circuits to generate output signals on the same pins 402 used to receive the input data signals. For some embodiments, $V_{DDQ}$ and $V_{SSQ}$ supply lines may be used to power the output drivers.

In any case, as the operating frequencies of DRAM devices increase, the rate at which the data signals $DQ_{1-N}$ may change increases accordingly. As a result, simultaneous switching noise may be induced on power supply lines used as a return path for the data signals. Therefore, as illustrated, input capacitance (shown as capacitors 404) and/or ESD circuits 420 for the data lines 405 may be coupled with $V_{DDQ}$ and $V_{SSQ}$ lines 206 and 208, while receiver circuits 410 may be powered from $V_{DD}$ and $V_{SS}$ 106 and 108, thus decoupling the receivers 410 from noise induced by rapidly switching data signals $DQ_{1-N}$.

While, for some embodiments, other signal lines of DRAM devices may be coupled with $V_{DDQ}$ and $V_{SSQ}$ lines 206 and 2–8 to decouple the corresponding switching noise from their receivers 410, data lines $DQ_{1-N}$ are likely to switch most often and be the least predictable. As illustrated, for some embodiments, a reference voltage VREF utilized by the receiver circuits 410 may be protected from data signal switching noise by coupling input capacitors 404 and ESD circuitry on a corresponding reference voltage supply line 407 to the VD and VSS supply lines 106 and 108.

CONCLUSION

By decoupling power supply lines used to power receiver circuits from common input signal return paths, the effects of simultaneous switching noise (SSN) may be reduced. As a result, more stable operation of input receivers and, thus, a device overall, may be achieved.

While the foregoing is directed to embodiments of the present invention, other and further embodiments of the invention may be devised without departing from the basic scope thereof, and the scope thereof is determined by the claims that follow.

What is claimed is:

1. A method for reducing jitter of an input signal applied to an input node of a receiver circuit via an input signal line, comprising:
coupling power supply nodes of the receiver circuit to first power supply lines;
providing a return path for the input signal via second power supply lines, decoupled from the first power supply lines, wherein the second power supply lines are coupled to the input signal line via capacitance between a package pin and the input node of the receiver circuit;
coupling electro-static discharge (ESD) circuitry, placed inline with the input signal line, with the second power supply voltage lines; and
coupling a voltage reference line, for carrying a reference voltage signal used by the receiver circuit in determining a logic level of the input signal, to the first power supply voltage lines.

2. An input circuit configuration, comprising:
a receiver circuit coupled to first power supply lines for power;
an input signal line for carrying an input signal to the receiver circuit;
a return path for the input signal through input capacitance associated with the input signal line, and one or more second power supply lines, decoupled from the first power supply lines;
electro-static discharge (ESD) circuitry in line with the input signal line; and
further comprising a voltage reference line for carrying a reference voltage signal used by the receiver circuit in determining a logic level of the input signal, wherein capacitance associated with the voltage reference line is coupled to the first power supply lines for power.

3. The input circuit configuration of claim 2, wherein the ESD circuitry is coupled to the second power supply lines for power.

4. An integrated circuit (IC) device, comprising:
first power supply lines;
one or more second power supply lines;
one or more package pins for receiving input signals supplied to the device;
receiver circuits coupled to the first power supply lines for power;
input signal lines for carrying the input signals to input nodes of the receiver circuits;
one or more common return paths for the input signals provided through input capacitance between the package pins and input nodes of the receiver circuits and the second power supply lines;
electro-static discharge (ESD) circuitry in line with the input signal lines, wherein the ESD circuitry is coupled to the second power supply lines for power; and
further comprising a voltage reference line for carrying a reference voltage signal used by the receiver circuit in determining a logic level of the input signal, wherein capacitance associated with the voltage reference line is coupled to the first power supply lines for power.

5. The IC device of claim 4, further comprising output circuitry for driving output signals, wherein the output circuitry is coupled to the second power supply lines for power.

6. A dynamic random access memory (DRAM) device comprising:
one or more memory cell arrays;
one or more package pins for receiving data signals supplied to the device, the data signals carrying information to be written to the memory cell arrays;
first power supply lines;
one or more second power supply lines;
receiver circuits coupled to the first power supply lines for power;
data signal lines for carrying the data signals from the package pins to input nodes of the receiver circuits;
one or more common return paths for the data signals provided through input capacitance between the package pins and input nodes of the receiver circuits and the second power supply lines;
electro-static discharge (ESD) circuitry in line with the data signal lines, wherein the ESD circuitry is coupled to the second power supply lines for power; and
a voltage reference line for carrying a reference voltage signal used by the receiver circuits in determining logic levels of the data signals, wherein capacitance associated with the voltage reference line is coupled to the first power supply lines for power.

7. The DRAM device of claim 6, further comprising output circuitry for driving output signals multiplexed onto the package pins, wherein the output circuitry is coupled to the second power supply lines for power.

8. A method for reducing utter of an input signal applied to an input node of a receiver circuit via an input signal line, comprising:
coupling power supply nodes of the receiver circuit to first power supply lines;
providing a return path for the input signal via second power supply lines, decoupled from the first power supply lines, wherein the second power supply lines are coupled to the input signal line via capacitance between a package pin and the input node of the receiver circuit;
coupling electro-static discharge (ESD) circuitry, placed inline with the input signal line, with the second power supply voltage lines; and
coupling a voltage reference line, for carrying a reference voltage signal used by the receiver circuit in determining a logic level of the input signal, to the second power supply voltage lines.

9. A dynamic random access memory (DRAM) device comprising:
   one or more memory cell arrays;
   one or more package pins for receiving data signals supplied to the device, the data signals carrying information to be written to the memory cell arrays;
   first power supply lines;
   one or more second power supply lines;
   receiver circuits coupled to the first power supply lines for power;
   data signal lines for carrying the data signals from the package pins to input nodes of the receiver circuits;
   one or more common return paths for the data signals provided through input capacitance between the package pins and input nodes of the receiver circuits and the second power supply lines;
   electro-static discharge (ESD) circuitry in line with the data signal lines, wherein the ESD circuitry is coupled to the second power supply lines for power; and
   a voltage reference line for carrying a reference voltage signal used by the receiver circuits in determining logic levels of the data signals, wherein capacitance associated with the voltage reference line is coupled to the second power supply lines for power.

10. The DRAM device of claim 9, further comprising output circuitry for driving output signals multiplexed onto the package pins, wherein the output circuitry is coupled to the second power supply lines for power.

* * * * *